US009928825B2

(12) United States Patent
Liu et al.

(10) Patent No.: US 9,928,825 B2
(45) Date of Patent: Mar. 27, 2018

(54) ACTIVE NOISE-REDUCTION EARPHONES AND NOISE-REDUCTION CONTROL METHOD AND SYSTEM FOR THE SAME

(71) Applicant: Goertek Inc., Weifang (CN)

(72) Inventors: Song Liu, Weifang (CN); Linzhang Wang, Weifang (CN); Bo Li, Weifang (CN)

(73) Assignee: GOERTEK INC., Weifang (CN)

( * ) Notice: Subject to any disclaimer, the term of this patent is extended or adjusted under 35 U.S.C. 154(b) by 33 days.

(21) Appl. No.: 15/126,754

(22) PCT Filed: Sep. 9, 2015

(86) PCT No.: PCT/CN2015/089249
§ 371 (c)(1),
(2) Date: Sep. 16, 2016

(87) PCT Pub. No.: WO2016/107206
PCT Pub. Date: Jul. 7, 2016

(65) Prior Publication Data
US 2018/0018954 A1 Jan. 18, 2018

(30) Foreign Application Priority Data
Dec. 31, 2014 (CN) .......................... 2014 1 0854148

(51) Int. Cl.
*G10K 11/16* (2006.01)
*H03B 29/00* (2006.01)
(Continued)

(52) U.S. Cl.
CPC .. *G10K 11/1786* (2013.01); *G10K 2210/1081* (2013.01); *G10K 2210/3016* (2013.01);
(Continued)

(58) Field of Classification Search
CPC ..... G10K 11/178–11/1788; G10K 2210/1081; G10K 2210/108; G10K 2210/1082;
(Continued)

(56) References Cited

U.S. PATENT DOCUMENTS 6,449,369 B1 * 9/2002 Carme ............... G10K 11/1784 381/71.12
6,996,241 B2 * 2/2006 Ray ...................... G10K 11/178 381/71.1
(Continued)

FOREIGN PATENT DOCUMENTS

CN 102111697 6/2011
CN 102306496 1/2012
(Continued)

OTHER PUBLICATIONS

Office Action from corresponding Chinese Application No. 201410854148.1 dated May 27, 2017 (3 pages).

*Primary Examiner* — Xu Mei
(74) *Attorney, Agent, or Firm* — Harness, Dickey & Pierce, P.L.C.

(57) ABSTRACT

The present method comprises: providing a feedforward microphone outside of each earphone of the active noise-reduction earphones; detecting an amount of external noise by using the feedforward microphone; calculating a weighted energy of a noise signal; and determining whether it is needed to activate the active noise-reduction system based on the weighted energy. When the active noise-reduction control is needed, calculating energy values of two sub-bands, corresponding to the feedforward noise-reduction amount and the feedback noise-reduction amount respectively, in the noise signal, thereby determining the noise-reduction amounts of the feedforward noise reduction system and the feedback noise-reduction system, and controlling the earphone to perform corresponding feedforward
(Continued)

noise reduction and feedback noise reduction. Compared with the existing active noise-reduction technologies with a fixed noise reduction, the present invention can optimize the noise-reduction effect.

15 Claims, 3 Drawing Sheets

(51) Int. Cl.
*H04R 3/00* (2006.01)
*G10K 11/178* (2006.01)
*H04R 1/10* (2006.01)

(52) U.S. Cl.
CPC ................ *G10K 2210/3026* (2013.01); *G10K 2210/3027* (2013.01); *G10K 2210/3046* (2013.01); *H04R 1/1008* (2013.01); *H04R 1/1083* (2013.01); *H04R 2410/07* (2013.01)

(58) Field of Classification Search
CPC ... G10K 2210/3016; G10K 2210/3026; G10K 2210/3027; G10K 2210/3046; H04R 1/1008; H04R 1/1083; H04R 5/033; H04R 2410/07
USPC ....... 381/71.1, 71.2, 71.6, 71.8, 71.9, 71.13, 381/71.14, 72, 94.1–94.8
See application file for complete search history.

(56) References Cited

U.S. PATENT DOCUMENTS

| | | | | |
|---|---|---|---|---|
| 8,184,822 | B2 * | 5/2012 | Carreras | G10K 11/178 381/71.6 |
| 8,280,065 | B2 * | 10/2012 | Nadjar | G10K 11/178 381/71.1 |
| 8,385,559 | B2 * | 2/2013 | Theverapperuma | G10K 11/178 381/71.1 |
| 8,693,700 | B2 * | 4/2014 | Bakalos | G10K 11/178 381/58 |
| 8,903,101 | B2 * | 12/2014 | Christoph | G10K 11/1784 379/406.01 |
| 9,020,160 | B2 * | 4/2015 | Gauger, Jr. | G10K 11/1788 381/71.1 |
| 9,202,456 | B2 * | 12/2015 | Lee | G10K 11/1784 |
| 9,379,751 | B2 * | 6/2016 | Liu | H04R 1/1083 |
| 9,549,249 | B2 * | 1/2017 | Sontacchi | H04R 3/002 |
| 9,749,732 | B2 * | 8/2017 | Liu | H04R 1/1041 |
| 2004/0264706 | A1 | 12/2004 | Ray et al. | |
| 2010/0272284 | A1 | 10/2010 | Joho et al. | |
| 2012/0014532 | A1 * | 1/2012 | Kimura | H04R 1/1083 381/71.6 |
| 2012/0197638 | A1 | 8/2012 | Li et al. | |
| 2013/0024194 | A1 | 1/2013 | Zhao et al. | |
| 2013/0142349 | A1 | 6/2013 | Liu et al. | |
| 2014/0314245 | A1 | 10/2014 | Asada et al. | |

FOREIGN PATENT DOCUMENTS

| | | |
|---|---|---|
| CN | 102449687 | 5/2012 |
| CN | 102469399 | 5/2012 |
| CN | 104081789 | 10/2014 |
| CN | 204046798 | 12/2014 |
| CN | 104602163 | 5/2015 |
| EP | 3107312 | 12/2016 |
| WO | 2008139155 | 11/2008 |

* cited by examiner

ACTIVE NOISE-REDUCTION EARPHONES AND NOISE-REDUCTION CONTROL METHOD AND SYSTEM FOR THE SAME

FIELD OF THE INVENTION

The present invention relates to the technical field of active noise reduction for intelligent earphones, and more specifically relates to a noise-reduction control method and system for active noise-reduction earphones, as well as active noise-reduction earphones.

BACKGROUND OF THE INVENTION

Earphones have been widely applied in people's daily life and work. Besides the functions of enjoying music and entertainments, earphones are also widely applied to insulate noise for maintaining a relatively quiet environment. However, for low-frequency noises, earphones are very limited in the effect and capability of noise insulation.

An active noise-reduction technology adopts an approach of generating a signal having a same amplitude but an inverse phase relative to an external noise so as to counteract the noise entering into an earphone. However, the active noise-reduction technologies adopted in current earphone are mostly fixed noise-reduction technologies, which have the following defects: in a constantly changing external environment, when the external noise is equivalent to a fixed noise-reduction amount, a relatively good noise-reduction effect will be generated; however, when the external noise is higher than the fixed noise-reduction amount, it will occur that the noise-reduction effect cannot be optimal; or when the external noise is lower than the fixed noise-reduction amount, an active noise-reduction module will actually produce a new noise into human ears.

SUMMARY OF THE INVENTION

In view of the above, a main objective of the present invention is to provide a noise-reduction control method and system for active noise-reduction earphones, as well as active noise-reduction earphones, so as to solve a technical problem that an active noise-reduction technology with fixed noise-reduction cannot optimize a noise-reduction effect.

In order to achieve the above objective, a technical solution according to an embodiment of the present invention is implemented as such:

In one aspect, an embodiment of the present invention provides a noise-reduction control method for active noise-reduction earphones, a feedforward microphone being provided on each earphone of the active noise-reduction earphones, respectively; the feedforward microphone being disposed outside of the earphone; the noise-reduction control method comprising:

performing frequency-domain weighting and temporal-domain weighting to a noise signal collected by the feedforward microphone at current time to obtain a weighted energy;

judging whether active noise-reduction control is needed at the current time based on the weighted energy;

when the active noise-reduction control is needed, calculating an energy value of a first sub-band and an energy value of a second sub-band of the noise signal collected by the feedforward microphone at the current time, wherein the first sub-band and the second sub-band are determined based on a feedforward noise-reduction curve and a feedback noise-reduction curve of the earphone, respectively;

determining a feedforward noise-reduction amount and a feedback noise-reduction amount based on the energy value of the first sub-band and the energy value of the second sub-band, respectively;

controlling the earphone to perform feedforward noise reduction based on the feedforward noise-reduction amount, and controlling the earphone to perform feedback noise reduction based on the feedback noise-reduction amount.

In another aspect, an embodiment of the present invention further provides a noise-reduction control system for active noise-reduction earphones, a feedforward microphone being provided on each earphone of the active noise-reduction earphones, respectively; the feedforward microphone being disposed outside of the earphone; the noise-reduction control system comprising:

an energy weighting unit configured to perform frequency-domain weighting and temporal-domain weighting to a noise signal collected by the feedforward microphone at current time to obtain a weighted energy;

an active noise-reduction judging unit configured to judge whether active noise-reduction control is needed at the current time based on the weighted energy obtained by the energy weighting unit;

a sub-band energy calculating unit configured to, when the active noise-reduction judging unit judges that the active noise-reduction control is needed, calculate an energy value of a first sub-band and an energy value of a second sub-band of the noise signal collected by the feedforward microphone at the current time, wherein the first sub-band and the second sub-band are determined based on a feedforward noise-reduction curve and a feedback noise-reduction curve of the earphone, respectively;

a noise-reduction amount determining unit configured to determine a feedforward noise-reduction amount and a feedback noise-reduction amount based on the energy value of the first sub-band and the energy value of the second sub-band calculated by the sub-band energy calculating unit, respectively;

a feedforward noise-reduction controlling unit configured to control the earphone to perform feedforward noise reduction based on the feedforward noise-reduction amount; and a feedback noise-reduction controlling unit configured to control the earphone to perform feedback noise reduction based on the feedback noise-reduction amount.

In a further aspect, an embodiment of the present invention provides active noise-reduction earphones, a feedforward microphone and a feedback microphone being provided on each earphone of the active noise-reduction earphones respectively, wherein the feedforward microphone is disposed outside of the earphone, the feedback microphone is disposed inside a coupled cavity coupling the earphone with a human ear; each earphone of the active noise-reduction earphones is provided with the noise-reduction control system according to the technical solution above.

Compared with the prior art, the embodiments of the present invention provide the following advantageous effects:

The technical solution provided in the embodiments of the present invention can detect an environment condition in which a user wears the active noise-reduction earphones based on auditory characteristics of human ears by adopting technical means of calculating a weighted energy of a signal from frequency domain and temporal domain, so as to comprehensively judge whether active noise-reduction control is needed for a type and frequency distribution of the current noise; dynamically calculate the adjusted noise-reduction amount by technical means of calculating sub-band energy values of the noise signal that is real-time collected by the microphone; and employ different noise-reduction solutions intelligently for different noise-reduction systems by technical means of performing feedforward noise reduction based on the feedforward noise-reduction amount and performing feedback noise reduction based on the feedback noise-reduction amount. The present solution can accurately control noise reduction, dynamically and intelligently adjust noise reduction; therefore, compared with the active noise reduction technique with fixed noise reduction, the present solution can optimize a noise reduction effect.

In one preferred solution, the present invention may also dispose a feedback microphone on each earphone of the active noise-reduction earphones so as to finely adjust a feedback noise-reduction amount of the noise-reduction system using a feedback microphone disposed within a coupled cavity coupling the earphone and a human ear, which guarantees that the noise suppression reaches an optimal effect. In another preferred solution, the present invention employs dynamic dual-threshold values such that the dynamic adjustment process is a gradually changing process, which avoids noise caused by frequently adjusting the noise-reduction levels. In a further preferred solution, the present invention may also determine whether wind noise exists currently based on correlation between noise signals collected by two feedforward microphones, and perform a special noise-reduction control in the case of wind noise.

BRIEF DESCRIPTION OF THE ACCOMPANYING DRAWINGS

The drawings, which provide further understanding of the present invention and constitute part of the specification, are used, together with the embodiments of the present invention, for explaining the present invention, rather than limiting the present invention. In the accompanying drawings.

DETAILED DESCRIPTION OF THE PREFERRED EMBODIMENTS

A main technical idea of the present invention is to detect, using multiple microphones, an environment in which a user wears active noise-reduction earphones; to judge whether to use active noise-reduction for a type and frequency distribution of a current noise based on an auditory effect of human ears, and to adopt a dynamic and adjustable noise-reduction scheme, in conjunction with two noise-reduction systems (i.e., feedforward and feedback), in the earphones to guarantee an optimized effect of noise suppression.

In order to make the objectives, technical solutions, and advantages of the present invention much clearer, the embodiments of the present invention will be described in further detail with reference to the accompanying drawings.

Figure 1:
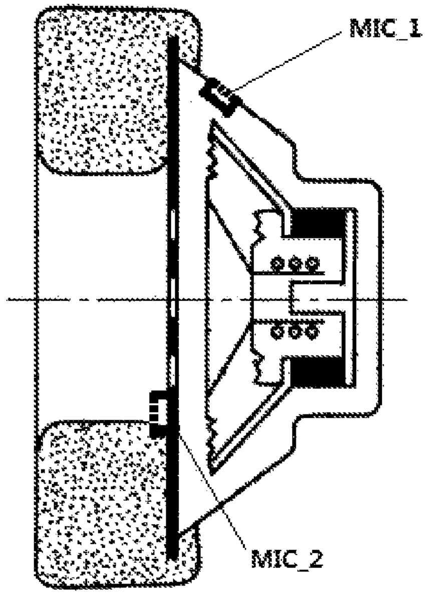
FIG. 1 illustrates a schematic diagram of an active noise-reduction earphone provided with two microphones according to an embodiment of the present invention.

In order to overcome the deficiencies of traditional active noise-reduction earphones, which make a uniform processing to all noises without considering kinds of external noises, the present solution adopts multiple microphones to detect the external environment. FIG. 1 illustrates a schematic diagram of an active noise-reduction earphone provided with two microphones according to an embodiment of the present invention. One is a feedforward microphone, e.g., MIC_1 in FIG. 1, disposed outside of the earphone; the other is a feedback microphone, e.g., MIC_2 in FIG. 1, disposed within a coupled cavity coupling the earphone with a human ear. After the earphones are powered, the active noise-reduction earphones start operating (which may be forcedly turned off). The whole noise-reduction system may also be divided into a feedforward noise-reduction system and a feedback noise-reduction system. The two systems focus on different noise-reduction frequency bands; therefore, it is required to intelligently detect the external environment and intelligently combine the two noise-reduction systems, so as to achieve an optimal noise-reduction amount.

A principle of the active noise-reduction earphones is to counteract noise by producing a signal with a phase inversed to a phase of an external noise, thereby achieving the objective of noise reduction. As shown in FIG. 1, MIC_1 is mounted outside of the earphone (e.g., upper corner of the outside) for detecting noise in the external environment, thereby controlling an earphone to produce a signal with an inverse phase. That is a feedforward noise-reduction system. The MIC_2 is mounted within a coupled cavity coupling the earphone with a human ear. It will detect an amplitude of the noise residual within the coupled cavity and also produce a signal with an inverse phase relative to the noise from the coupled cavity, which further reduces the noise entering into human ears, thereby maximizing the noise-reduction amount.

Figure 2:
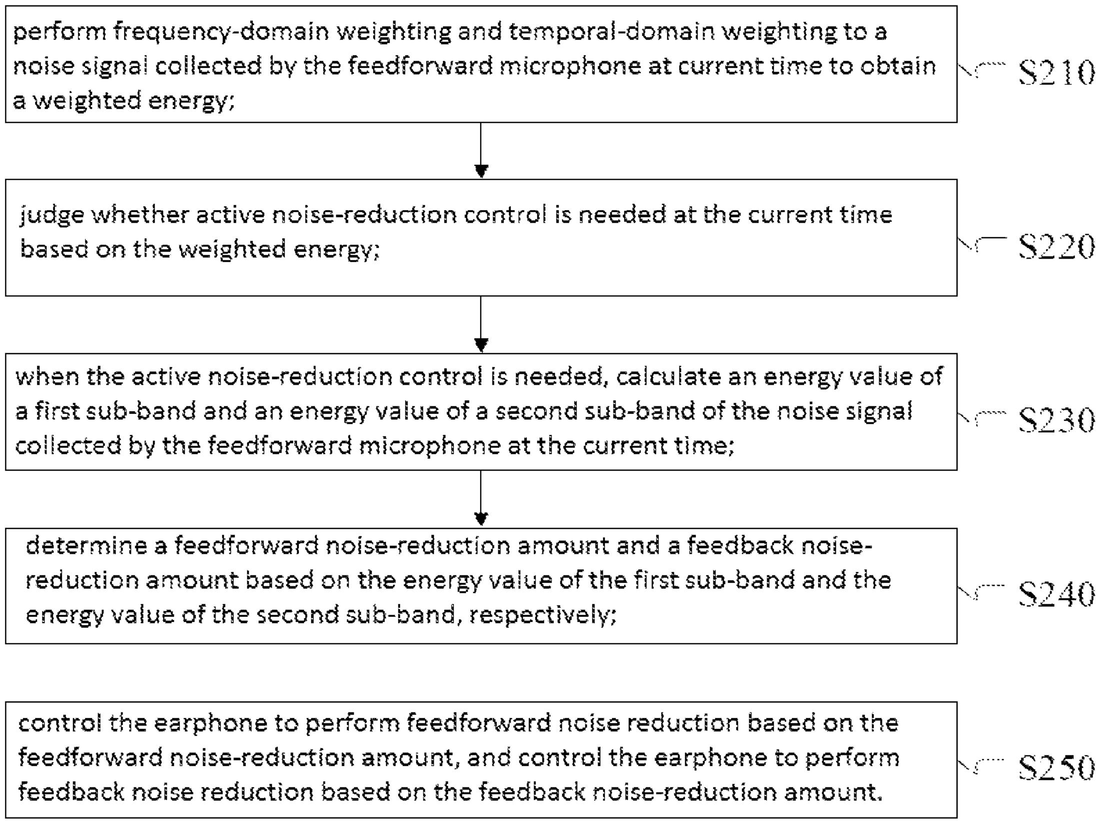
FIG. 2 illustrates a flow diagram of a noise-reduction control method for active noise-reduction earphones according to an embodiment of the present invention.

On one hand, the embodiments of the present invention provide a noise-reduction control method for active noise-reduction earphones. FIG. 2 illustrates a flow diagram of a noise-reduction control method for active noise-reduction earphones according to an embodiment of the present invention. As illustrated in FIG. 2, the method comprises:

Step S210: performing frequency-domain weighting and temporal-domain weighting to a noise signal collected by a feedforward microphone at current time to obtain a weighted energy.

Due to the specialties of human ears, i.e., human ears are less sensitive to low-frequency and high-frequency signals than to medium frequencies. In order to calculate human sense to noise more truly, the present embodiment performs weighted measurement to an input signal so as to adopt a dynamic and tunable noise-reduction scheme for the type and frequency distribution of the current noise.

The weighted measurement comprises frequency-domain weighting and temporal-domain weighting.

First Step: frequency-domain weighting. A frequency filter R(f) is designed according to the following frequency weighting equation, wherein f denotes the frequency of a signal, and $R_A(f)$ denotes a frequency weighting coefficient:

$$R_A(f) = \frac{12200^2 \cdot f^4}{(f^2 + 20.6^2)\sqrt{(f^2 + 107.7^2)(f^2 + 737.9^2)}\,(f^2 + 12200^2)}$$

If the sound signal is s1, while y(n) is derived after frequency weighting, then $y(n)=R_A(f)*s1$.

Second Step: temporal-domain weighting. The frequency weighted data are more in conformity with human ears' auditory sense. However, if the noise suddenly disappears, its sound level does not disappear immediately at the temporal domain, and there will be a falling rate. At this time, a time constant is used to smooth the signal for performing temporal-domain weighting processing.

Temporal-domain weighting may be performed with the following time weighting manner:

$$SPL(n)=\alpha*\text{Energy}(n)+(1-\alpha)*SPL(n-1)$$

Wherein SPL(n) denotes a sound level, i.e., finally derived weighted energy; a denotes a temporal weighting coefficient; Energy(n) denotes an energy value of a current frame, which is a square of the frequency-weighted y(n).

Step S220: judging whether active noise-reduction control is needed at the current time based on the weighted energy.

The weighted energy SPL(n) derived from the step S210 will be compared with a threshold value. When the SPL(n) is greater than the threshold value, active noise-reduction will be performed; if the SPL(n) is less than the threshold value, active noise reduction will be unnecessary. The size of the threshold value needs to be selected based on an actually designed earphone.

Step S230: when the active noise-reduction control is needed, calculating an energy value of a first sub-band and an energy value of a second sub-band of the noise signal collected by the feedforward microphone at the current time.

In the present embodiment, suppression of external environment noise is performed in divided frequency bands, i.e., the effects of noise reduction are also different over different frequencies. This mainly considers that if the active noise reduction mainly focuses on the low-frequency part, while the noise entering into human ears is mainly high-frequency noise, if the same active noise-reduction method is still adopted over different frequencies at this time, it essentially makes no help to noise reduction; instead, it will introduce more noise, causing the human ears uncomfortable. Therefore, by performing different noise reduction processing to different frequency bands, the present embodiment enhances noise-reduction effect.

Wherein, a first sub-band and a second sub-band are determined based on a feedforward noise-reduction curve and a feedback noise-reduction curve of an active noise reduction earphone, respectively. Specifically, the feedforward noise-reduction curve is obtained by detecting a feedforward noise-reduction performance of the active noise-reduction earphone; the feedback noise-reduction curve is obtained by detecting a feedback noise-reduction performance of the active noise-reduction earphone; the first sub-band is selected within a certain frequency band range nearby the maximum amplitude point of the feedforward noise reduction curve (a difference between a frequency point of the maximum amplitude in the certain frequency band range and a frequency point of the maximum amplitude point of the entire feedforward noise reduction curve is less than a set value), and the second sub-band is selected within a certain frequency band range nearby the maximum amplitude point of the feedback noise-reduction curve (a difference between a frequency point of the maximum amplitude in the certain frequency band range and a frequency point of the maximum amplitude point of the entire feedback noise-reduction curve is less than a set value).

When the noise meets the threshold requirement such that it is needed to perform the active noise-reduction control, it is needed to resolve an energy value of the first sub-band and an energy value of the second sub-band, respectively.

There are two kinds of calculation manners: one may be making a noise signal s1 collected by the feedforward microphone MIC_1 at the current time subjected to a bandpass filter $h_A(n)$ of the first sub-band A and a bandpass filter $h_B(n)$ of the second sub-band B. The second kind of manner may be transforming s1 into the frequency domain through FFT (Fast Fourier Transformation), and then making statistics on the energy values of the first sub-band A and the second sub-band B. Now, explanations will be made with the first sub-band A as an example.

Manner 1: calculate the energy value $\text{Energy}_A$ of the first sub-band A through a sub-band filter method; see the equation as follows:

$$y(n)=s1*h_A(n)$$

$$\text{Energy}_A=\Sigma y^2(n)$$

Wherein, y(n) denotes the sub-band signal s1 after $h_A(n)$, n denotes time.

Manner 2: a method of calculating the sub-band energy $\text{Energy}_A$ of the first sub-band A through FFT; see the equation below:

$$S1(k)=FFT(s1)$$

$$Energy_A=\sum_{subband\,1}^{subband\,2}\alpha\cdot S1^2(k)$$

Wherein, α denotes a weight coefficient, whose value may be determined based on a frequency-response curve; (subband 1, subband2) denotes a frequency-domain range of the sub-band A.

Step S240: determining a feedforward noise-reduction amount and a feedback noise reduction amount based on the energy value of the first sub-band and the energy value of the second sub-band, respectively.

After the energies of the first sub-band and the second sub-band are derived, the energy values of the two sub-bands are compared with a preset threshold value. Specifically, in the present embodiment, the energy value of the first sub-band and the energy value of the second sub-band are compared with threshold values corresponding to different noise-reduction levels, respectively, to determine an initial value of a feedforward noise-reduction amount and an initial value of the feedback noise-reduction amount, respectively.

It should be noted that when the earphone is turned on, it is defaulted that active noise reduction is not needed currently. When it is determined to need to start active noise reduction, initial values of two sub-band energies are calculated; then, the feedforward noise reduction amount and the feedback noise-reduction amount at the initial time are determined based on the noise-reduction levels corresponding to the initial values.

Because the environmental noise where the earphone is located will change constantly, the present embodiment tracks and calculates a sub-band energy value once in each certain time interval (e.g., every second) so as to keep track of the change. Change of the noise causes the feedforward active noise-reduction and feedback active noise-reduction modules to re-adjust their own noise-reduction amounts. However, the adjusting process is a gradually changing process. In order to prevent the noise-reduction level from jumping back and forth due to change of noise around the threshold, which causes uncomfortable auditory sense to human ears, the present solution adopts a dual-threshold manner.

Specifically, an ascending threshold value and a descending threshold value are provided for adjacent two noise-reduction levels, respectively; moreover, the ascending threshold value is greater than the descending threshold value; the energy values of the sub-bands of the noise signal collected by the feedforward microphone at each time are recorded. It should be noted that the energy value of the first sub-band and the energy value of the second sub-band are required to be recorded, separately. Because the method of determining the feedforward noise-reduction amount based on the energy value of the first sub-band is identical to the method of determining the feed-back noise-reduction amount based on the energy value of the second sub-band, the description below will generally refer to them as a sub-band, without distinguishing a first sub-band from a second sub-band.

When it is determined that the energy value of the sub-band at the current time is in a process from small to large (the change trend of the energy value may be obtained based on the recorded energy values of the sub-band), if the energy value of the sub-band is greater than the descending threshold value, the feedforward noise-reduction amount (corresponding to the first sub-band) or the feedback noise-reduction amount (corresponding to the second sub-band) is kept at the previous noise-reduction level; and if the energy value of the sub-band is greater than the ascending threshold value, the feedforward noise reduction amount or the feedback noise reduction amount is increased by one noise-reduction level.

When it is determined that the energy value of the sub-band at the current time is in a process from large to small, if the energy value of the sub-band is smaller than the ascending threshold value, the feedforward noise reduction amount or the feedback noise-reduction amount is kept at the previous noise-reduction level; and if the energy value of the sub-band is less than the descending threshold value, the feedforward noise-reduction amount or the feedback noise-reduction amount is decreased by one noise-reduction level.

Figure 3:
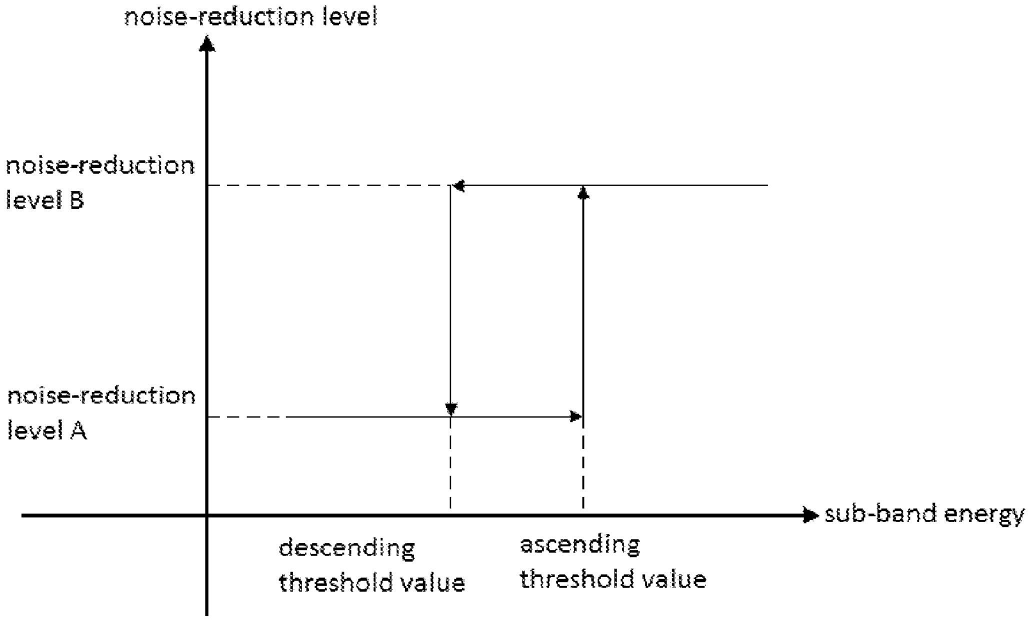
FIG. 3 illustrates a schematic diagram of level jumping of a noise-reduction system according to an embodiment of the present invention.

FIG. 3 illustrates a schematic diagram of level jumping of a noise-reduction system according to an embodiment of the present invention. As illustrated in FIG. 3, in adjacent two noise-reduction levels (e.g., noise-reduction level A, noise-reduction level B), an ascending threshold value Threshold0_up and a descending threshold value Threshold0_down are employed; in addition, Threshold0_up>Threshold0_down constantly stands.

1. First change scenario: during the process when the sub-band energy of the external environment noise changes from small to large, i.e., when the system is at the noise-reduction level A, when the sub-band energy is greater than Threshold0_down, the active noise-reduction system does not jump between noise-reduction levels; however, if the energy continues being enlarged till the sub-band energy is greater than Threshold0_up, the feedforward noise-reduction amount or the feedback noise-reduction amount of the active noise-reduction system jumps upward by one level to the noise-reduction level B.

2. On the contrary, in a second change scenario, the sub-band energy of the external environment noise changes from large to small, i.e., when the system is at the noise-reduction level B, if the sub-band energy is less than Threshold0_up, the active noise-reduction system does not jump between noise-reduction levels; however, if the energy continues being less till the sub-band energy is smaller than Threshold0_down, the feedforward noise-reduction amount or the feedback noise-reduction amount of the active noise-reduction system jumps downward by one level to noise-reduction level A.

The number of noise-reduction levels is selected and partitioned based on the needs of the active noise-reduction earphone, i.e., the noise-reduction level may also jump between noise-reduction level B and noise-reduction level C, and the like. For example, the noise-reduction levels may be preferably selected to 10. If the noise-reduction amplitude range that can be achieved by the active noise-reduction earphone is 25 dB, then the dB numbers corresponding to respective noise-reduction levels increment, if the first level is a 2.5 dB noise-reduction amount, then the second level is a 5 dB noise-reduction amount, the third level is a 7.5 dB noise reduction amount, and so on.

Step 250: controlling the earphone to perform feedforward noise reduction based on the determined feedforward noise-reduction amount, and controlling the earphone to perform feedback noise-reduction based on the determined feedback noise-reduction amount. For example, controlling the feedforward noise-reduction module in the earphone to perform feedforward noise reduction based on the determined feedforward noise reduction amount, and controlling the feedback noise reduction module in the earphone to perform feedback noise reduction based on the determined feedback reduction amount.

Till now, the noise-reduction control method for the active noise-reduction earphone as illustrated in FIG. 2 is completed. Operations of steps S210 to S250 may be performed by a control chip in the earphone.

The technical solution provided in the embodiments of the present invention can detect an environment condition in which a user wears the active noise-reduction earphone according to auditory characteristics of human ears by adopting technical means of calculating a weighted energy of a signal from the perspectives of frequency domain and temporal domain, so as to comprehensively judge whether active noise-reduction control is needed for a type and frequency distribution of the current noise; can dynamically calculate a size of adjusting the noise-reduction amount by technical means of calculating sub-band energy values of the noise signal that is real-time collected by the microphone; and can employ different noise-reduction solutions intelligently for different noise-reduction systems by technical means of performing feedforward noise reduction based on the feedforward noise reduction amount and performing feedback noise reduction based on the feedback noise-reduction amount. The present solution can accurately control noise-reduction, dynamically and intelligently adjust the noise reduction; therefore, compared with the active noise reduction technique with fixed noise reduction, the present solution can optimize a noise reduction effect.

Through the present invention, the active noise-reduction amount of the earphone can be adaptively adjusted based on the environment where the user uses the earphone, which ensures that the earphone achieves a maximum noise-reduction amount with respect to the external environmental noise; meanwhile, the user's use state is judged and no damage will be caused to music signals.

Based on the above embodiments, a noise-reduction control method in another preferred embodiment provides a solution of adaptively fine tuning the noise-reduction amount of the feedback microphone so as to enhance the accuracy of feedback noise-reduction control, the method further comprising:

When determining that no sound is played within the earphone, calculating, using the feedback microphone provided respectively within a coupled cavity coupling the earphone with a human ear on each earphone of the active noise-reduction earphone, energy of the signal collected by the feedback microphone at the current time.

Then, in step S250, controlling the earphone to perform feedback noise reduction based on the determined feedback noise reduction amount comprises: adjusting the feedback noise-reduction amount based on the calculated energy of the signal collected by the feedback microphone at the current time; and controlling the earphone to perform feedback noise reduction based on the adjusted feedback noise reduction amount. In this way, an appropriate adaptive amendment is performed to the feedback noise-reduction amount based on the noise-reduction result of the feedback microphone.

The process of performing an appropriate adaptive amendment to the feedback noise-reduction amount is provided below:

After controlling the earphone to perform feedback noise reduction based on the adjusted feedback noise reduction amount, obtaining a noise-reduced signal collected by the feedback microphone, and calculating the energy of the noise-reduced signal; judging whether the energy of the signal collected by the feedback microphone at the current time is less than the energy of the noise-reduced signal; if so, controlling the earphone to perform feedback noise reduction based on the adjusted feedback noise reduction amount; if not, controlling the earphone to perform feedback noise reduction based on the feedback noise-reduction amount before adjustment.

In other words, noise-reduction control is first performed by applying the solution illustrated in FIG. 2, when judging the energy of signal s2 collected by the feedback microphone exceeds a certain threshold, the feedback noise reduction amount will be lifted to use a new noise reduction level so as to adjust the feedback noise-reduction amount; then, the signal energy before adjustment is compared with the signal energy after adjustment; if lifting the feedback noise reduction amount can reduce the energy of s2, the adjusted new noise-reduction level will be continued to use; if lifting the feedback noise-reduction amount cannot reduce the energy of s2, the previous noise-reduction level before adjustment will be restored.

The preferred embodiment of the present invention ensures an optimal effect of noise suppression by adaptively fine tuning the feedback noise-reduction amount of the feedback noise-reduction system using a feedback microphone disposed within a coupled cavity coupling the earphone with a human ear.

In another preferred embodiment, the noise-reduction control method according to the present invention provides a solution for wind noise; the method further comprises:

calculating a correlation between noise signals collected by two feedforward microphones on two earphones of the active noise-reduction earphone at the current time, and judging whether wind noise exists at the current time based on a calculation result of the correlation; if it is judged that wind noise exists at the current time, controlling the earphone to stop feedforward noise reduction based on a feedforward noise-reduction amount, and determining an increment of the feedback noise-reduction amount based on the feedforward noise-reduction amount, thereby controlling the earphone to perform feedback noise reduction based on the incremented feedback noise reduction amount.

Considering that the feedforward active noise-reduction system cannot play a role of noise reduction with respect to wind noise, which, instead, will also magnify the noise, the present embodiment adopts a solution of closing the feedforward active noise reduction while increasing the feedback noise-reduction amount when wind noise appears.

The wind noise detection employed in the present embodiment is implemented based on signal correlation. The inventors find through analyzing the principle of producing a wind noise that when wind passes through a microphone, pressure will be produced on the microphone. The wind noise collected by each microphone is random, i.e., the wind noises collected by any two microphones are irrelevant. However, for any active noise and signal, there exists a correlation between the signal collected by the microphone and the signal source. For a stereo microphone, correlation judgment may be performed using two inputs of the feedforward microphones: if the signals reaching the two feedforward microphones are irrelevant, it may be judged that wind noise is encountered currently. Because any other noise will have an extremely strong correlation with voice, judgment of the wind noise may be performed by calculating the correlation between signals of two feedforward microphones. The specific calculation procedure is provided below:

1. Suppose the signals collected by two feedforward microphones are x1(n), x2(n), respectively. First, calculate the FFTs of the two paths of signals, resulting in frequency-domain signals X1(k), X2(k) of the two paths of signals.

2. Calculate the autocorrelation function R(k) of the two paths of signals in the frequency domain based on the following autocorrelation equation, wherein conj denotes resolving a complex conjugate:

$$R(k)=X1(k)*\mathrm{conj}(X2(k))$$

3. Normalize the calculation results R(k) to smooth the calculation results. Whether wind noise exists may be confirmed based on the correlation between the smoothed calculation results derived in this step, i.e., when the smoothed calculation results indicate a low correlation, it is confirmed that wind noise exists. Or, enter in step 4 to perform judgment after extracting the smoothed calculation results derived in the present step.

4. Extract a correlation between signals at a preset frequency band (e.g., 93.75 Hz~781.25 Hz).

The preferred embodiment of the present invention may judge whether wind noise exists currently and perform noise-reduction control to eliminate the wind noise when the wind noise exists.

Figure 4:
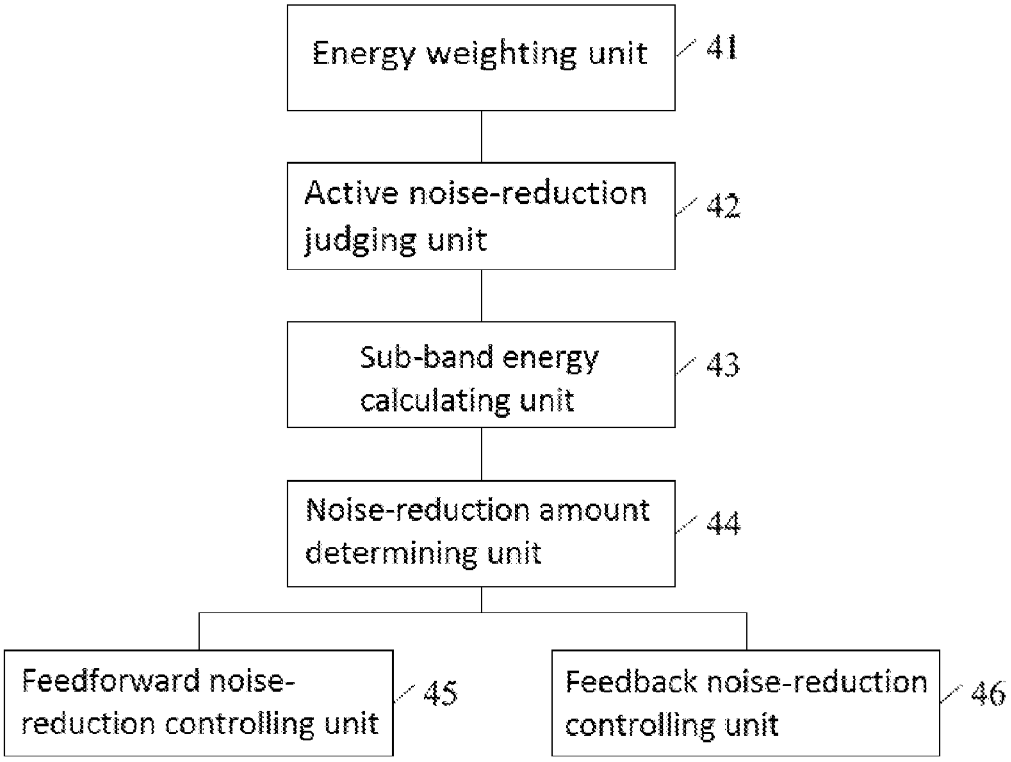
FIG. 4 illustrates a schematic structural diagram of a noise-reduction control system for active noise-reduction earphones according to an embodiment of the present invention.

In the other aspect, the embodiments of the present invention further provide a noise-reduction control system for an active noise-reduction earphone. FIG. 4 illustrates a schematic structural diagram of a noise-reduction control system for an active noise-reduction earphone according to an embodiment of the present invention, the noise-reduction control system comprising: an energy weighting unit 41, an active noise-reduction judging unit 42, a sub-band energy computing unit 43, a noise-reduction amount determining unit 44, a feedforward noise reduction controlling unit 45, and a feedback noise-reduction controlling unit 46.

Wherein, the energy weighting unit 41 is configured to perform frequency-domain weighting and temporal-domain weighting to a noise signal collected by a feedforward microphone at current time to obtain a weighted energy.

Due to the specialties of human ears, i.e., human ears are less sensitive to low-frequency and high-frequency signals than to medium frequencies. In order to calculate human sense to noise more truly, the present embodiment performs weighted measurement to an input signal so as to adopt a dynamic and tunable noise-reduction scheme for the type and frequency distribution of the current noise.

The energy weighting unit 41 is specifically configured to calculate the weighted energies of the frequency-domain weighting and the temporal-domain weighting.

First Step: frequency-domain weighting. A frequency filter R(f) is designed according to the following frequency weighting equation, wherein f denotes the frequency of a signal, and $R_A(f)$ denotes a frequency weighting coefficient:

$$R_A(f) = \frac{12200^2 \cdot f^4}{(f^2+20.6^2)\sqrt{(f^2+107.7^2)(f^2+737.9^2)}\,(f^2+12200^2)}$$

If the sound signal is s1, while y(n) is derived after frequency weighting, then $y(n)=R_A(f)*s1$.

Second Step: temporal-domain weighting. The frequency weighted data are more in conformity with human ears' auditory sense. However, if the noise suddenly disappears, its sound level does not disappear immediately in the temporal domain, and there will be a falling rate. At this time, a time constant is used to smooth the signal for performing temporal-domain weighting processing.

Temporal-domain weighting may be performed with the following time weighting manner:

$$SPL(n)=\alpha*\mathrm{Energy}(n)+(1-\alpha)*SPL(n-1)$$

Wherein SPL(n) denotes a sound level, i.e., finally derived weighted energy; α denotes a temporal weighting coefficient; Energy(n) denotes an energy value of a current frame, which is a square of the frequency-weighted y(n).

The active noise-reduction judging unit 42 is configured to judge whether active noise-reduction control is needed at the current time based on the weighted energy obtained by the energy weighting unit 41.

The sub-band energy calculating unit 43 is configured to, when the active noise-reduction judging unit 42 determines a need of the active noise-reduction control, calculate an energy value of a first sub-band and an energy value of a second sub-band of the noise signal collected by the feed-forward microphone at the current time, wherein the first sub-band and the second sub-band are determined based on a feedforward noise-reduction curve and a feedback noise-reduction curve of the earphone, respectively.

In the present embodiment, suppression of external environment noise is performed in divided frequency bands, i.e., over different frequencies, the effects of noise reduction are also different. This mainly considers that if the active noise reduction mainly focuses on the low-frequency part, while the noise entering into human ears is mainly high-frequency noise, if the same active noise-reduction method is still adopted over different frequencies at this time, it essentially makes no help to noise reduction; instead, it will introduce more noise, causing the human ears uncomfortable. Therefore, by performing different noise reduction processing to different frequency bands, the present embodiment enhances noise-reduction effect.

Specifically, the feedforward noise-reduction curve is obtained by detecting a feedforward noise-reduction performance of the active noise-reduction earphone; the feedback noise-reduction curve is obtained by detecting a feedback noise-reduction performance of the active noise-reduction earphone; the first sub-band is selected within a certain frequency band range nearby the maximum amplitude point of the feedforward noise reduction curve (a difference between a frequency point of the maximum amplitude in the certain frequency band range and the frequency point of the maximum amplitude point of the entire feedforward noise reduction curve is less than a set value), and the second sub-band is selected within a certain frequency band range nearby the maximum amplitude point of the feedback noise-reduction curve (a difference between the frequency point of the maximum amplitude in the certain frequency band range and the frequency point of the maximum amplitude point of the entire feedback noise-reduction curve is less than a set value).

When the noise meets the threshold requirement such that it is needed to perform the active noise-reduction control, it is needed to resolve an energy value of the first sub-band and an energy value of the second sub-band, respectively.

There are two kinds of calculation manners: one may be making a noise signal s1 collected by the feedforward microphone MIC_1 at the current time subjected to a bandpass filter $h_A(n)$ of the first sub-band A and a bandpass filter $h_B(n)$ of the second sub-band B. The second kind of manner may be transforming s1 into the frequency domain through FFT (Fast Fourier Transformation), and then making statistics on the energy values of the first sub-band A and the second sub-band B. Now, explanations will be made with the first sub-band A as an example.

Manner 1: calculate the energy value $\mathrm{Energy}_A$ of the first sub-band A through the sub-band filter method; see the equation as follows:

$$y(n)=s1*h_A(n)$$

$$\mathrm{Energy}_A=\Sigma y^2(n)$$

Wherein, y(n) denotes the sub-band signal s1 after $h_A(n)$, n denotes time.

Manner 2: a method of calculating the sub-band energy $\mathrm{Energy}_A$ of the first sub-band A through FFT; see the equation below:

$$S1(k) = FFT(s1)$$

$$Energy_A = \sum_{subband\,1}^{subband\,2} \alpha \cdot S1^2(k)$$

Wherein, α denotes a weight coefficient, whose value may be determined based on a frequency-response curve; (subband 1, subband2) denotes a frequency-domain range of the sub-band A.

The noise-reduction amount determining unit 44 is configured to determine a feedforward noise-reduction amount and a feedback noise reduction amount based on the energy value of the first sub-band and the energy value of the second sub-band, respectively, which are calculated by the sub-band energy calculating unit 43;

Preferably, the noise-reduction amount determining unit 44 comprises an initial value determining module, a dual-threshold setting module, an energy value recording module, a noise-reduction level increasing module, and a noise-reduction level decreasing module;

The initial value determining module is configured to compare the energy value of the first sub-band and the energy value of the second sub-band with threshold values corresponding to different noise-reduction levels, respectively, to determine an initial value of a feedforward noise-reduction amount and an initial value of the feedback noise-reduction amount, respectively;

The dual-threshold setting module is configured to set an ascending threshold value and a descending threshold value for adjacent two noise-reduction levels, respectively, the ascending threshold value being greater than the descending threshold value;

The energy value recording module is configured to record the energy values of the first sub-band and the second sub-band of the noise signal collected by the feedforward microphone at each time.

The noise-reduction level increasing module is configured to, when it is determined that the energy value of the first sub-band or the energy value of the second sub-band at the current time is in a process from small to large, if the energy value of the first sub-band or the second sub-band is greater than the descending threshold value, keep the feedforward noise-reduction amount or the feedback noise-reduction amount at the previous noise-reduction level; and if the energy value of the first sub-band or second sub-band is greater than the ascending threshold value, increase the feedforward noise reduction amount or the feedback noise reduction amount by one noise-reduction level.

The noise-reduction level decreasing module is configured to, when it is determined that the energy value of the first sub-band or the energy value of the second sub-band at the current time is in a process from large to small, if the energy value of the first sub-band or the energy value of the second sub-band is smaller than the ascending threshold value, keep the feedforward noise reduction amount or the feedback noise-reduction amount at the previous noise-reduction level; and if the energy value of the first sub-band or the energy value of the second sub-band is less than the descending threshold value, decrease the feedforward noise-reduction amount or the feedback noise-reduction amount by one noise-reduction level.

The feedforward noise-reduction controlling unit 45 is configured to control the earphone to perform feedforward noise reduction based on the feedforward noise-reduction amount; and The feedback noise-reduction controlling unit 46 is configured to control the earphone to perform feedback noise-reduction based on the feedback noise-reduction amount.

In one preferred embodiment, the noise-reduction control system provides a feedback microphone on each earphone of the active noise-reduction earphone, the feedback microphone being disposed within a coupled cavity of the earphone. The noise-reduction control system further comprises a feedback energy calculating unit configured to calculate energy of the signal collected by the feedback microphone at the current time when it is determined that no sound is played in the earphone.

Preferably, the feedback noise-reduction controlling unit 46 in the embodiment shown in FIG. 4 further comprises: a feedback noise-reduction amount adjusting module configured to adjust the feedback noise-reduction amount based on the energy of the signal collected by the feedback microphone at the current time, which is calculated by the feedback energy calculating unit, to control the earphone to perform feedback noise reduction based on the adjusted feedback noise reduction amount.

Further preferably, the feedback noise-reduction amount adjusting module is also specifically configured to, after controlling the earphone to perform feedback noise reduction based on the adjusted feedback noise reduction amount, obtain a noise-reduced signal collected by the feedback microphone, and calculate the energy of the noise-reduced signal; judge whether the energy of the signal collected by the feedback microphone at the current time is less than the energy of the noise-reduced signal; if so, control the earphone to perform feedback noise reduction based on the adjusted feedback noise reduction amount; if not, control the earphone to perform feedback noise reduction based on the feedback noise-reduction amount before adjustment.

The preferred embodiment of the present invention ensures an optimal effect of noise suppression by adaptively fine tuning the feedback noise-reduction amount of the feedback noise-reduction system using a feedback microphone disposed within a coupled cavity coupling the earphone with a human ear.

In another preferred embodiment, the noise-reduction control system further comprises:

a wind noise judging unit configured to calculate a correlation between noise signals collected by two feedforward microphones on two earphones of the active noise-reduction earphones at the current time, and judge whether wind noise exists at the current time based on a calculation result of the correlation;

a wind noise processing unit configured to, if it is judged by the wind noise judging unit that wind noise exists at the current time, control the earphone to stop feedforward noise reduction based on a feedforward noise-reduction amount, and determine an increment of the feedback noise-reduction amount based on the feedforward noise-reduction amount, thereby controlling the earphone to perform feedback noise reduction based on the incremented feedback noise reduction amount.

The preferred embodiment of the present invention may judge whether wind noise exists currently and perform noise-reduction control to eliminate the wind noise when the wind noise exists.

According to another aspect of the present invention, there is further provided active noise-reduction earphones, a feedforward microphone and a feedback microphone being provided on each earphone of the active noise-reduction earphones, respectively, wherein the feedforward microphone is disposed outside of the earphone, the feedback microphone is disposed inside a coupled cavity coupling the earphone with a human ear; each earphone of the active noise-reduction earphones is provided with the noise-reduction control system according to the technical solution above.

Figure 5:
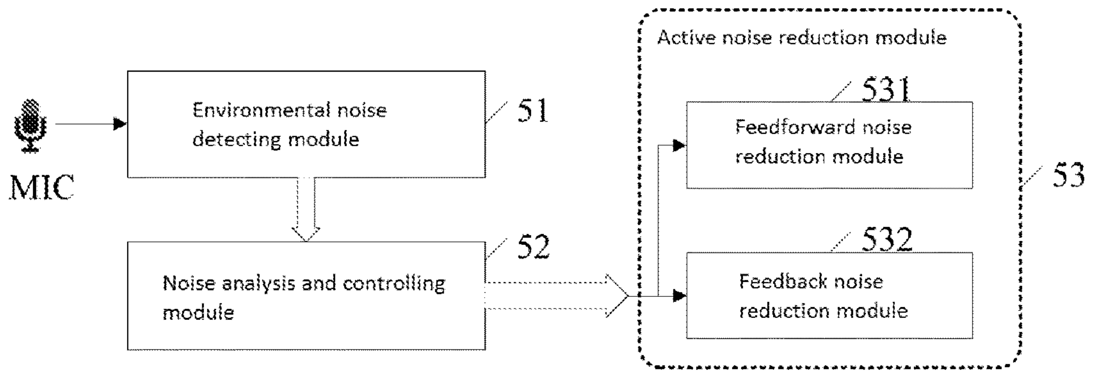
FIG. 5 illustrates a structural diagram of an active noise-reduction earphone according to an embodiment of the present invention.

Refer to FIG. 5, in which a structural diagram of an active noise-reduction earphone provided according to the embodiments of the present invention is presented. The active noise-reduction earphone comprises an environmental noise detecting module 51, a noise analyzing and controlling module 52, a feedforward noise-reduction module 531, and a feedback noise-reduction module 532, wherein the feedforward noise-reduction module 531 and the feedback noise-reduction module 532 jointly constitute an active noise-reduction module 53; while the functions performed by the environment noise detection module 51 and the noise analyzing and controlling module 52 may also be implemented by the noise-reduction control system for the active noise reduction earphones as illustrated in FIG. 4.

When the active noise-reduction earphones operate, the environment noise detecting module 51 real-time collects the noise signal at the current time through a feedforward microphone to detect the environment noise. The noise analyzing and controlling module 52 performs weighted energy calculation to the noise signal collected by the feedforward microphone at the current time, and analyzes to judge whether an active noise-reduction control needs to be performed at the current time based on the weighted energy; if it is judged to need an active noise-reduction control, further calculates and determines the feedforward noise-reduction amount and the feedback noise-reduction amount, to control the feedforward noise-reduction module 531 in the active noise-reduction module 53 to perform feedforward noise reduction based on the feedforward noise reduction amount, and to control the feedback noise-reduction module 532 in the active noise-reduction module 53 to perform feedback noise reduction based on the feedback noise reduction amount.

In view of the above, a noise-reduction control method and system for active noise-reduction earphones and active noise-reduction earphones, as provided by the embodiments of the present invention, can suppress environmental noise by detecting the environment of the active noise-reduction earphones and adopting a dynamic and tunable noise-reduction solution with respect to the type and frequency distribution of the current noise; compared with the existing active noise-reduction technology with fixed noise reduction, the noise-reduction effect can reach the optimal.

In one preferred solution, the present invention may also dispose a feedback microphone on each earphone of the active noise-reduction earphones so as to finely tune a feedback noise-reduction amount of the noise-reduction system using a feedback microphone disposed within a coupled cavity coupling the earphones and a human ear, which guarantees that the noise suppression reaches an optimal effect. In another preferred solution, the present invention employs dynamic dual-threshold values such that the dynamic adjustment process is a gradually changing process, which avoids noise caused by frequently adjusting the noise-reduction levels. In a further preferred solution, the present invention may also determine whether wind noise exists currently based on correlation between noise signals collected by two feedforward microphones, and perform a special noise-reduction control in the case of wind noise.

What have been described above are only preferred embodiments of the present invention, not intended to limit the protection scope of the present invention. Any modifications, equivalent replacements, improvements and the like within the spirit and principle of the present invention should be covered within the protection scope of the present invention.

The invention claimed is:

1. A noise-reduction control method for active noise-reduction earphones, characterized in providing a feedforward microphone on each earphone of the active noise-reduction earphones, respectively; the feedforward microphone being disposed outside of the earphone; the noise-reduction control method comprising:

performing frequency-domain weighting and temporal-domain weighting to a noise signal collected by the feedforward microphone at current time to obtain a weighted energy;

judging whether active noise-reduction control is needed at the current time based on the weighted energy;

when the active noise-reduction control is needed, calculating an energy value of a first sub-band and an energy value of a second sub-band of the noise signal collected by the feedforward microphone at the current time, wherein the first sub-band and the second sub-band are determined based on a feedforward noise-reduction curve and a feedback noise-reduction curve of the earphone, respectively;

determining a feedforward noise-reduction amount and a feedback noise-reduction amount based on the energy value of the first sub-band and the energy value of the second sub-band, respectively;

controlling the earphone to perform feedforward noise reduction based on the feedforward noise-reduction amount, and controlling the earphone to perform feedback noise reduction based on the feedback noise-reduction amount.

2. The noise-reduction control method according to claim 1, characterized in providing a feedback microphone on each earphone of the active noise-reduction earphones, respectively, the feedback microphone being provided within a coupled cavity coupling the earphone with a human ear, the noise-reduction control method further comprises:

calculating energy of a signal collected by the feedback microphone at the current time when it is determined that no sound is played in the earphone;

the controlling the earphone to perform feedback noise reduction based on the feedback noise-reduction amount further comprises:

adjusting the feedback noise-reduction amount based on the calculated energy of the signal collected by the feedback microphone at the current time; and controlling the earphone to perform feedback noise reduction based on the adjusted feedback noise-reduction amount.

3. The noise-reduction control method according to claim 2, characterized in that the controlling the earphone to perform feedback noise reduction based on the adjusted feedback noise-reduction amount further comprises:

after controlling the earphone to perform feedback noise reduction based on the adjusted feedback noise reduction amount, obtaining a noise-reduced signal collected by the feedback microphone, and calculating energy of the noise-reduced signal;

judging whether the energy of the signal collected by the feedback microphone at the current time is less than the energy of the noise-reduced signal; if so, controlling the earphone to perform feedback noise reduction based on the adjusted feedback noise-reduction amount; if not, controlling the earphone to perform feedback noise reduction based on the feedback noise-reduction amount before adjustment.

4. The noise-reduction control method according to claim 1, characterized in that the determining a feedforward noise-reduction amount and a feedback noise-reduction amount based on the energy value of the first sub-band and the energy value of the second sub-band, respectively, comprises:

comparing the energy value of the first sub-band and the energy value of the second sub-band with threshold values corresponding to different noise-reduction levels, respectively, to determine an initial value of the feedforward noise-reduction amount and an initial value of the feedback noise-reduction amount, respectively.

5. The noise-reduction control method according to claim 4, characterized in that the determining a feedforward noise-reduction amount and a feedback noise-reduction amount based on the energy value of the first sub-band and the energy value of the second sub-band, respectively, further comprises:

setting an ascending threshold value and a descending threshold value for adjacent two noise-reduction levels, respectively, the ascending threshold value being greater than the descending threshold value;

recording the energy value of the first sub-band and the energy value of the second sub-band of the noise signal collected by the feedforward microphone at each time;

when it is determined that the energy value of the first sub-band or the energy value of the second sub-band at the current time is in a process from small to large, if the energy value of the first sub-band or the energy value of the second sub-band is greater than the descending threshold value, keeping the feedforward noise-reduction amount or the feedback noise-reduction amount at the previous noise-reduction level; and if the energy value of the first sub-band or the energy value of the second sub-band is greater than the ascending threshold value, increasing the feedforward noise reduction amount or the feedback noise reduction amount by one noise-reduction level;

when it is determined that the energy value of the first sub-band or the energy value of the second sub-band at the current time is in a process from large to small, if the energy value of the first sub-band or the energy value of the second sub-band is smaller than the ascending threshold value, keeping the feedforward noise reduction amount or the feedback noise-reduction amount at the previous noise-reduction level; and if the energy value of the first sub-band or the energy value of the second sub-band is less than the descending threshold value, decreasing the feedforward noise-reduction amount or the feedback noise-reduction amount by one noise-reduction level.

6. The noise-reduction control method according to claim 1, characterized in that the noise-reduction control method further comprises:

calculating a correlation between noise signals collected by two feedforward microphones on two earphones of the active noise-reduction earphones at the current time, and judging whether wind noise exists at the current time based on a calculation result of the correlation;

if it is judged that wind noise exists at the current time, controlling the earphone to stop feedforward noise reduction based on the feedforward noise-reduction amount, and determining an increment of the feedback noise-reduction amount based on the feedforward noise-reduction amount, thereby controlling the earphone to perform feedback noise reduction based on the incremented feedback noise-reduction amount.

7. A noise-reduction control system for active noise-reduction earphones, characterized in that a feedforward microphone is provided on each earphone of the active noise-reduction earphones, respectively, the feedforward microphone being disposed outside of the earphone; the noise-reduction control system comprises:

an energy weighting unit configured to perform frequency-domain weighting and temporal-domain weighting to a noise signal collected by the feedforward microphone at current time to obtain a weighted energy;

an active noise-reduction judging unit configured to judge whether active noise-reduction control is needed at the current time based on the weighted energy obtained by the energy weighting unit;

a sub-band energy calculating unit configured to, when the active noise-reduction judging unit judges that the active noise-reduction control is needed, calculate an energy value of a first sub-band and an energy value of a second sub-band of the noise signal collected by the feedforward microphone at the current time, wherein the first sub-band and the second sub-band are determined based on a feedforward noise-reduction curve and a feedback noise-reduction curve of the earphone, respectively;

a noise-reduction amount determining unit configured to determine a feedforward noise-reduction amount and a feedback noise-reduction amount based on the energy value of the first sub-band and the energy value of the second sub-band calculated by the sub-band energy calculating unit, respectively;

a feedforward noise-reduction controlling unit configured to control the earphone to perform feedforward noise reduction based on the feedforward noise-reduction amount; and a feedback noise-reduction controlling unit configured to control the earphone to perform feedback noise reduction based on the feedback noise-reduction amount.

8. The noise-reduction control system according to claim 7, characterized in that a feedback microphone is provided on each earphone of the active noise-reduction earphones, respectively, the feedback microphone being provided within a coupled cavity coupling the earphone with a human ear, the noise-reduction control system further comprises: a feedback energy calculating unit configured to calculate energy of a signal collected by the feedback microphone at the current time when it is determined that no sound is played in the earphone;

the feedback noise-reduction controlling unit further comprises:

a feedback noise-reduction amount adjusting module configured to adjust the feedback noise-reduction amount based on the energy of the signal collected by the feedback microphone at the current time calculated by the feedback energy calculating unit; and control the earphone to perform feedback noise-reduction based on the adjusted feedback noise-reduction amount.

9. The noise-reduction control system according to claim 8, characterized in that the feedback noise-reduction amount adjusting module is further configured to: after controlling the earphone to perform feedback noise reduction based on the adjusted feedback noise-reduction amount, obtain a noise-reduced signal collected by the feedback microphone, and calculate energy of the noise-reduced signal; judge whether the energy of the signal collected by the feedback microphone at the current time is less than the energy of the noise-reduced signal; if so, control the earphone to perform feedback noise reduction based on the adjusted feedback noise-reduction amount; if not, control the earphone to perform feedback noise reduction based on the feedback noise-reduction amount before adjustment.

10. The noise-reduction control system according to claim 7, characterized in that the noise-reduction amount determining unit comprises:

an initial value determining module configured to compare the energy value of the first sub-band and the energy value of the second sub-band with threshold values corresponding to different noise-reduction levels, respectively, to determine an initial value of the feedforward noise-reduction amount and an initial value of the feedback noise-reduction amount, respectively;

a dual-threshold setting module configured to set an ascending threshold value and a descending threshold value for adjacent two noise-reduction levels, respectively, the ascending threshold value being greater than the descending threshold value;

an energy value recording module configured to record the energy value of the first sub-band and the energy value of the second sub-band of the noise signal collected by the feedforward microphone at each time;

the noise-reduction level increasing module configured to, when it is determined that the energy value of the first sub-band or the energy value of the second sub-band at the current time is in a process from small to large, if the energy value of the first sub-band or the energy value of the second sub-band is greater than the descending threshold value, keep the feedforward noise-reduction amount or the feedback noise-reduction amount at the previous noise-reduction level; and if the energy value of the first sub-band or the energy value of the second sub-band is greater than the ascending threshold value, increase the feedforward noise-reduction amount or the feedback noise-reduction amount by one noise-reduction level; and a noise-reduction level decreasing module configured to, when it is determined that the energy value of the first sub-band or the energy value of the second sub-band at the current time is in a process from large to small, if the energy value of the first sub-band or the energy value of the second sub-band is smaller than the ascending threshold value, keep the feedforward noise-reduction amount or the feedback noise-reduction amount at the previous noise-reduction level; and if the energy value of the first sub-band or the energy value of the second sub-band is less than the descending threshold value, decrease the feedforward noise-reduction amount or the feedback noise-reduction amount by one noise-reduction level.

11. The noise-reduction control system according to claim 7, characterized in that the noise-reduction control system further comprises:

a wind noise judging unit configured to calculate a correlation between noise signals collected by two feedforward microphones on two earphones of the active noise-reduction earphones at the current time, and judge whether wind noise exists at the current time based on a calculation result of the correlation;

a wind noise processing unit configured to, if it is judged that wind noise exists at the current time, control the earphone to stop feedforward noise reduction based on a feedforward noise-reduction amount, and determine an increment of the feedback noise-reduction amount based on the feedforward noise-reduction amount, thereby controlling the earphone to perform feedback noise reduction based on the incremented feedback noise-reduction amount.

12. Active noise-reduction earphones, characterized in that a feedforward microphone and a feedback microphone are provided on each earphone of the active noise-reduction earphones respectively, wherein the feedforward microphone is disposed outside of the earphone, the feedback microphone is disposed inside a coupled cavity coupling the earphone with a human ear; each earphone of the active noise-reduction earphones is provided with the noise-reduction control system according to claim 7.

13. The active noise-reduction earphones according to claim 12, characterized in that the noise-reduction control system further comprises: a feedback energy calculating unit configured to calculate energy of a signal collected by the feedback microphone at the current time when it is determined that no sound is played in the earphone;

the feedback noise-reduction controlling unit further comprises:

a feedback noise-reduction amount adjusting module configured to adjust the feedback noise-reduction amount based on the energy of the signal collected by the feedback microphone at the current time calculated by the feedback energy calculating unit; and control the earphone to perform feedback noise-reduction based on the adjusted feedback noise-reduction amount, or, the noise-reduction control system further comprises:

a wind noise judging unit configured to calculate a correlation between noise signals collected by two feedforward microphones on two earphones of the active noise-reduction earphones at the current time, and judge whether wind noise exists at the current time based on a calculation result of the correlation;

a wind noise processing unit configured to, if it is judged that wind noise exists at the current time, control the earphone to stop feedforward noise reduction based on a feedforward noise-reduction amount, and determine an increment of the feedback noise-reduction amount based on the feedforward noise-reduction amount, thereby controlling the earphone to perform feedback noise reduction based on the incremented feedback noise-reduction amount.

14. The active noise-reduction earphones according to claim 13, characterized in that the feedback noise-reduction amount adjusting module is further configured to: after controlling the earphone to perform feedback noise reduction based on the adjusted feedback noise-reduction amount, obtain a noise-reduced signal collected by the feedback microphone, and calculate energy of the noise-reduced signal; judge whether the energy of the signal collected by the feedback microphone at the current time is less than the energy of the noise-reduced signal; if so, control the earphone to perform feedback noise reduction based on the adjusted feedback noise-reduction amount; if not, control the earphone to perform feedback noise reduction based on the feedback noise-reduction amount before adjustment.

15. The active noise-reduction earphones according to claim 12, characterized in that the noise-reduction amount determining unit comprises:

an initial value determining module configured to compare the energy value of the first sub-band and the energy value of the second sub-band with threshold values corresponding to different noise-reduction levels, respectively, to determine an initial value of the feedforward noise-reduction amount and an initial value of the feedback noise-reduction amount, respectively;

a dual-threshold setting module configured to set an ascending threshold value and a descending threshold value for adjacent two noise-reduction levels, respectively, the ascending threshold value being greater than the descending threshold value;

an energy value recording module configured to record the energy value of the first sub-band and the energy value of the second sub-band of the noise signal collected by the feedforward microphone at each time;

the noise-reduction level increasing module configured to, when it is determined that the energy value of the first sub-band or the energy value of the second sub-band at the current time is in a process from small to large, if the energy value of the first sub-band or the energy value of the second sub-band is greater than the descending threshold value, keep the feedforward noise-reduction amount or the feedback noise-reduction amount at the previous noise-reduction level; and if the energy value of the first sub-band or the energy value of the second sub-band is greater than the ascending threshold value, increase the feedforward noise-reduction amount or the feedback noise-reduction amount by one noise-reduction level; and a noise-reduction level decreasing module configured to, when it is determined that the energy value of the first sub-band or the energy value of the second sub-band at the current time is in a process from large to small, if the energy value of the first sub-band or the energy value of the second sub-band is smaller than the ascending threshold value, keep the feedforward noise-reduction amount or the feedback noise-reduction amount at the previous noise-reduction level; and if the energy value of the first sub-band or the energy value of the second sub-band is less than the descending threshold value, decrease the feedforward noise-reduction amount or the feedback noise-reduction amount by one noise-reduction level.

* * * * *